United States Patent
Tachibana et al.

(10) Patent No.: US 10,246,771 B2
(45) Date of Patent: Apr. 2, 2019

(54) FILM FORMING METHOD AND PLASMA CHEMICAL VAPOR DEPOSITION APPARATUS

(71) Applicant: TOYOTA JIDOSHA KABUSHIKI KAISHA, Toyota-shi, Aichi-ken (JP)

(72) Inventors: Kazutaka Tachibana, Nagoya (JP); Takayasu Sato, Takahama (JP); Yoji Sato, Kasugai (JP); Hiromichi Nakata, Toyota (JP); Kazuyoshi Manabe, Toyota (JP); Seiji Okamura, Toyota (JP); Izuru Yamamoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/442,121

(22) Filed: Feb. 24, 2017

(65) Prior Publication Data
US 2017/0253961 A1 Sep. 7, 2017

(30) Foreign Application Priority Data
Mar. 1, 2016 (JP) .................................. 2016-038873

(51) Int. Cl.
*C23C 16/26* (2006.01)
*H05H 1/46* (2006.01)
(Continued)

(52) U.S. Cl.
CPC ............ *C23C 16/26* (2013.01); *C23C 16/511* (2013.01); *C23C 16/52* (2013.01); *H05H 1/46* (2013.01); *H05H 2001/4622* (2013.01)

(58) Field of Classification Search
CPC .. C23C 16/26; C23C 16/511; H01J 37/32192; H01J 37/32311;
(Continued)

(56) References Cited

U.S. PATENT DOCUMENTS

2009/0286011 A1 11/2009 Kousaka et al.
2016/0013023 A1* 1/2016 Taki ........................ C23C 16/26
427/575
2016/0376707 A1 12/2016 Sato et al.

FOREIGN PATENT DOCUMENTS

JP 2004-047207 A 2/2004
JP 2017-008389 A 1/2017
WO 2008/010537 A1 1/2008

OTHER PUBLICATIONS

Xu et al. "Plasma properties of a new surface-wave-sustained plasma source under conditions of depositing DLC films" Surface & Coatings Technology 201, p. 408-412 (Year: 2006).*

* cited by examiner

*Primary Examiner* — Dah-Wei D. Yuan
*Assistant Examiner* — Jose Hernandez-Diaz
(74) *Attorney, Agent, or Firm* — Oliff PLC (57) ABSTRACT

A PCVD apparatus includes a waveguide member which supports the workpiece with a portion of the waveguide member positioned in a reactor and causes microwaves output from a high-frequency output device to propagate to the workpiece. In a process of gradually increasing an intensity of the microwaves propagating to the workpiece through the waveguide member from "0", the intensity of the microwaves output from the high-frequency output device when step-up of a bias current of the workpiece occurs is referred to as a first intensity, and in a process of gradually increasing the intensity of the microwaves from the first intensity, the intensity of the microwaves when step-up of the bias current occurs again is referred to as a second intensity. During film formation, the microwaves having an intensity of higher than the first intensity and lower than the second intensity are output from the high-frequency output device.

4 Claims, 5 Drawing Sheets

(51) Int. Cl.
  *C23C 16/52* (2006.01)
  *C23C 16/511* (2006.01)
(58) Field of Classification Search
  CPC ........... H01J 37/32357; H01J 37/32366; H01J 37/32394; H01J 37/32403; H05H 2001/463; H05H 7/16
  See application file for complete search history.

FILM FORMING METHOD AND PLASMA CHEMICAL VAPOR DEPOSITION APPARATUS

INCORPORATION BY REFERENCE

The disclosure of Japanese Patent Application No. 2016-038873 filed on Mar. 1, 2016 including the specification, drawings and abstract is incorporated herein by reference in its entirety.

BACKGROUND OF THE INVENTION

1. Field of the Invention

The present invention relates to a film forming method of forming a diamond-like carbon film on a workpiece installed in a reactor, and a plasma chemical vapor deposition apparatus used in the film forming method.

2. Description of Related Art

An example of a plasma chemical vapor deposition apparatus (hereinafter, also referred to as "PCVD apparatus") is described in Japanese Patent Application Publication No. 2004-47207 (JP 2004-47207 A). The PCVD apparatus includes a reactor to which a process gas is supplied, a waveguide for supplying microwaves, and a dielectric window for closing an opening provided in a side wall of the reactor. In the reactor, the dielectric window supports a workpiece, and outside the reactor, the tip end of the waveguide is in contact with the dielectric window.

As microwaves propagate from the waveguide to the surface of the dielectric window, the process gas is decomposed into plasma in the vicinity of the dielectric window in the reactor. In addition, as the decomposed process gas adheres to the workpiece, a film based on the gas is generated on the workpiece.

The formation of a diamond-like carbon film (hereinafter also referred to as "DLC film") on the workpiece can be realized by supplying a hydrocarbon gas such as acetylene as the process has into the reactor, and decomposing the hydrocarbon gas into a plasma.

However, the DLC film may be formed on a member which requires both high hardness and a low coefficient of friction, such as a plunger of a high-pressure fuel pump provided in a fuel supply system of an internal combustion engine, in particular, it is desirable for the DLC film formed on the plunger to achieve both high hardness and a low coefficient of friction to a high level.

SUMMARY OF THE INVENTION

The present invention provides a film forming method and a PCVD apparatus capable of forming a DLC film that achieves both high hardness and a low coefficient of friction, to a high level, on a workpiece.

A film forming method is a method of forming a diamond-like carbon film on a workpiece installed in a reactor by decomposing a hydrocarbon gas supplied into the reactor of a plasma chemical vapor deposition apparatus (hereinafter, also referred to as "PCVD apparatus") into plasma using the PCVD apparatus. The plasma chemical vapor deposition apparatus includes a high-frequency output device which outputs microwaves, and a waveguide member which extends to an inside of the reactor from an outside of the reactor, supports the workpiece with a portion of the waveguide member positioned in the reactor, and causes the microwaves output from the high-frequency output device to propagate to the workpiece. The microwaves having an intensity of higher than a first intensity and lower than a second intensity are output from the high-frequency output device when a film is formed on the workpiece supported by the waveguide member. In a process of gradually increasing the intensity of the microwaves propagating to the workpiece through the waveguide member from "0", the intensity of the microwaves output from the high-frequency output device when step-up of a bias current of the workpiece occurs is referred to as the first intensity, and in a process of gradually increasing the intensity of the microwaves from the first intensity, the intensity of the microwaves when step-up of the bias current of the workpiece occurs again is referred to as the second intensity.

In this configuration, since the waveguide member directly supports the workpiece in the reactor, the microwaves supplied through the waveguide member directly propagate to the workpiece. In this case, in the reactor, the hydrocarbon gas is decomposed into plasma around the workpiece. Therefore, unlike a case where a dielectric is interposed between a waveguide and a workpiece, the diamond-like carbon film (hereinafter, referred to as "DLC film") based on the hydrocarbon gas decomposed into plasma can be formed on the workpiece even though the intensity of the microwaves output from the high-frequency output device is low. In other words, in a case where a film is formed on the workpiece using the apparatus in which the dielectric is interposed between the waveguide and the workpiece, a DLC film cannot be formed on the entire workpiece unless microwaves having a relatively high intensity are output from the high-frequency output device. Contrary to this, in this configuration, the microwaves can directly propagate to the workpiece from the waveguide member, and thus the DLC film can be formed on the entire workpiece even though the intensity of the microwaves output from the high-frequency output device is relatively low.

In addition, the DLC film is a film in which carbon having a diamond structure and carbon having a carbon structure coexist with each other, and the hardness of the DLC film increases as the proportion of carbon having the diamond structure increases. In addition, since the DLC film is formed on the workpiece using the hydrocarbon gas, hydrogen compounds are contained in the DLC film as impurities. In addition, as the amount of hydrogen compounds increases, the hardness of the DLC film decreases. Therefore, in order to increase the hardness of the DLC film, it is desirable to increase the proportion of carbon having the diamond structure and to decrease the amount of hydrogen compounds.

In addition, in a case where the number of dangling bonds per unit volume is referred to as a content, as the content of dangling bonds in the DLC film increases, the amount of bonds between carbon atoms and hydroxy groups on the surface of the DLC film is likely to increase. In addition, as the amount of hydroxy groups bonded to carbon atoms on the surface of the DLC film increases, the coefficient of friction of the DLC film can be decreased.

A hydrocarbon molecule has two or more carbon atoms and two or more hydrogen atoms. In this hydrocarbon molecule, the bonds between the carbon atoms include $\pi$ bonds and a $\sigma$ bond, and the bond strength of the $\sigma$ bond is higher than that of the $\pi$ bond. In addition, the strength of the bond between the carbon atom and the hydrogen atom is higher than the strength of the $\pi$ bond and is lower than the strength of the $\sigma$ bond.

The inventors obtained the following knowledge regarding the relationship between the intensity of the microwaves and the hardness and coefficient of friction of the DLC film in a case where the DLC film is formed on the workpiece using the PCVD apparatus that directly supports the workpiece with the waveguide member. That is, in a case where the bias current of the workpiece is observed when the intensity of the microwaves propagating to the workpiece through the waveguide member is gradually increased from "0", step-up of the bias current occurs when the intensity of the microwaves output from the high-frequency output device exceeds the first intensity, and step-up of the bias current occurs again when the intensity of the microwaves thereafter exceeds the second intensity.

In a case where the intensity of the microwaves output from the high-frequency output device during the film formation on the workpiece is equal to or lower than the first intensity; the energy when the hydrocarbon gas is decomposed into plasma is low, and most of the π bonds between the carbon atoms and the bonds between the carbon atoms and the hydrogen atoms are not broken and remain. In this case, a large amount of π bonds between the carbon atoms remain in the hydrocarbon gas decomposed into plasma, and thus the proportion of carbon having the diamond structure among the types of carbon contained in the DLC film is low. In addition, since not a significant amount of bonds between the carbon atoms and the hydrogen atoms are broken, the content of dangling bonds in the DLC film generated on the workpiece is low, and the amount of hydrogen compounds in the DLC film increases. Therefore, the DLC film formed under such conditions has low hardness and a high coefficient of friction.

In addition, in a case where the intensity of the microwaves output from the high-frequency output device during the film formation on the workpiece is equal to or higher than the second intensity, the energy when the hydrocarbon gas is decomposed into plasma is too high, and not only the π bonds between the carbon atoms and the bonds between the carbon atoms and the hydrogen atoms, but also the σ bond between the carbon atoms are easily broken. As described above, since the bonds between the carbon atoms and the hydrogen atoms are easily broken, the DLC film in this case has a high content of dangling bonds and a low amount of hydrogen compounds. In addition, atoms may be bonded together again in a process of adhering to the workpiece in the hydrocarbon gas decomposed into plasma as described above. However, in order for carbon atoms to be bonded together to form a σ bond, a higher energy than that in a case where carbon atoms are bonded together to form π bonds is necessary. That is, carbon atoms easily form it bonds but are less likely to form σ bonds. Therefore, in the DLC film formed on the workpiece, the number of molecules with carbon atoms forming σ bonds is small, and the proportion of carbon having the diamond structure among the types of carbon contained in the DLC film is low. Therefore, in the DLC film formed under such conditions, although the coefficient of friction is low, the hardness is not so high.

Contrary to this, in a case where the intensity of the microwaves output from the high-frequency output device during the film formation on the workpiece is higher than the first intensity and lower than the second intensity, the energy when the hydrocarbon gas is decomposed into plasma is not too high, and thus the π bonds between the carbon atoms and the bonds between the carbon atoms and the hydrogen atoms are easily broken, while the σ bond between the carbon atoms is less likely to be broken. That is, since most of the bonds between the carbon atoms and the hydrogen atoms are broken, in the DLC film formed on the workpiece, the content of dangling bonds is high and the amount of hydrogen compounds is small. In addition, since a large amount of σ the bonds between carbon atoms remain while the π bonds between the carbon atoms are broken, the proportion of carbon having the diamond structure among the types of carbon contained in the DLC film is high. Therefore, in the DLC film formed under such conditions, the coefficient of friction is low and the hardness is high. In addition, in the case where a film is formed on the workpiece by the apparatus in which the dielectric is interposed between the waveguide and the workpiece rather than by causing the microwaves to directly propagate to the workpiece from the waveguide member, the intensity of the microwaves output from the high-frequency output device typically becomes higher than the second intensity.

Therefore, in this configuration, by outputting the microwaves having an intensity of higher than the first intensity and lower than the second intensity from the high-frequency output device, the microwaves can be caused to propagate to the workpiece installed in the reactor such that the DLC film is formed on the workpiece. Therefore, a DLC film which achieves both high hardness and a low coefficient of friction to a high level can be formed on the workpiece.

In addition, in the film forming method, when the DLC film is formed on the workpiece by causing the microwaves to propagate to the workpiece installed in the reactor, the workpiece may be charged with a negative charge by supplying DC current to the workpiece. In this configuration, the microwaves propagate to the workpiece charged with the negative charge. Therefore, compared to a case where the DLC film is formed on the workpiece which is not charged with a negative charge, when the gas decomposed into plasma is attracted to the workpiece, the gas is more likely to evenly adhere to the entire workpiece.

For example, as the waveguide member of the PCVD apparatus, a waveguide member which has an elongated first conductor of which one end is positioned in the reactor to support the workpiece with the one end, and a cylindrical second conductor which is positioned on an outer peripheral side of the first conductor and is disposed coaxially with the first conductor can be used. In a case of forming a DLC film on the workpiece using this apparatus, the workpiece may be charged with a negative charge by supplying a DC voltage to the first conductor and the microwaves output from the high-frequency output device may be caused to flow through the surface of the first conductor.

In this configuration, the first conductor for supplying the microwaves to the workpiece is also used for supplying DC current to the workpiece. Therefore, compared to a case where a supply path for DC current is provided separately from a supply path for microwaves, film formation on the workpiece can be performed with an apparatus having a simple configuration. In addition, since the second conductor is disposed on the outer peripheral side of the first conductor, leakage of the microwaves to the outside of the apparatus can be prevented.

In the film forming method, the microwaves having an intensity of higher than an intermediate value between the first intensity and the second intensity and lower than the second intensity may be output from the high-frequency output device. Accordingly, a DLC film which achieves both high hardness and a low coefficient of friction to a higher level can be formed on the workpiece W.

The PCVD apparatus is an apparatus which forms a diamond-like carbon film on a workpiece installed in a reactor by decomposing a hydrocarbon gas supplied into the reactor into plasma. The PCVD apparatus includes: a high-frequency output device which outputs microwaves; and a waveguide member which extends to an inside of the reactor from an outside of the reactor, supports the workpiece with a portion of the waveguide member positioned in the reactor, and causes microwaves output from the high-frequency output device to propagate to the workpiece. The high-frequency output device outputs the microwaves having an intensity of higher than a first intensity and lower than a second intensity when a film is formed on the workpiece supported by the waveguide member. In a process of gradually increasing an intensity of the microwaves propagating to the workpiece through the waveguide member from "0", the intensity of the microwaves output from the high-frequency output device when step-up of a bias current of the workpiece occurs is referred to as the first intensity, and in a process of gradually increasing the intensity of the microwaves from the first intensity, the intensity of the microwaves when step-up of the bias current of the workpiece occurs again is referred to as the second intensity. In this configuration, the same effects as those of the film forming method can be obtained.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

An embodiment of a film forming method of forming a diamond-like carbon film on a workpiece and a plasma chemical vapor deposition apparatus used in the film forming method will be described with reference to FIGS. 1 to 10. In this specification, the diamond-like carbon film is referred to as "DLC film", and the plasma chemical vapor deposition apparatus is referred to as "PCVD apparatus".

Figure 1:
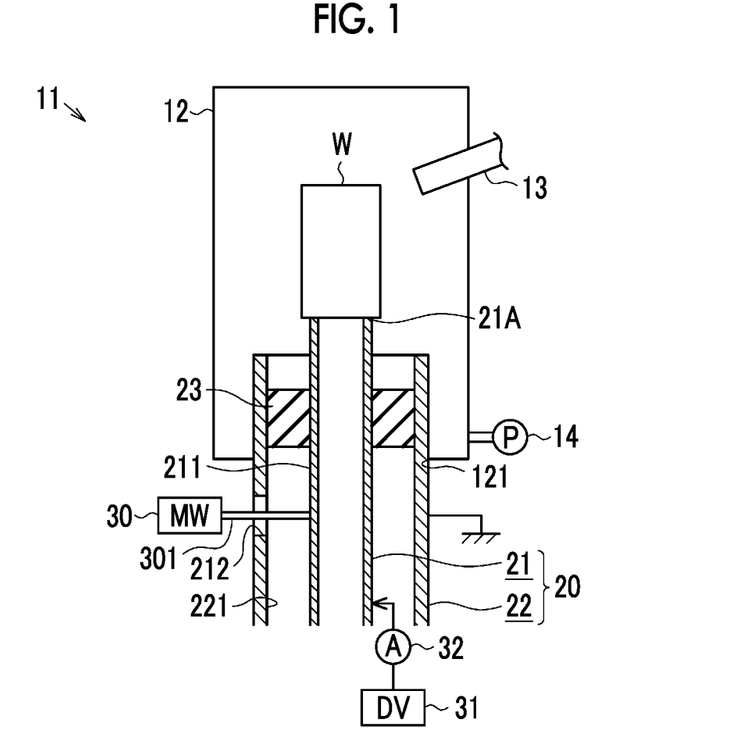
FIG. 1 is a sectional view schematically illustrating a part of a plasma chemical vapor deposition apparatus used in a film forming method of an embodiment.

As shown in FIG. 1, a PCVD apparatus 11 includes a reactor 12 in which a workpiece W made of a conductive material such as a metal is installed, in the reactor 12, a mixed gas containing acetylene, which is an example of a hydrocarbon gas, and an inert noble gas such as argon is supplied to the vicinity of the installation position of the workpiece W by the supply unit 13. The pressure in the reactor 12 is maintained at a specified pressure by an operation of a vacuum pump 14.

In addition, in the PCVD apparatus 11, a waveguide member 20 for inputting microwaves to the workpiece W installed in the reactor 12 is provided. The waveguide member 20 includes a cylindrical first conductor 21 having an elongated shape, and a cylindrical second conductor 22 which is positioned on the outer peripheral side of the first conductor 21 and is disposed coaxially with the first conductor 21. A space is formed between an inner surface 221 of the second conductor 22 and an outer surface 211 of the first conductor 21. That is, the outside air (air) as an insulating layer, which flows in through a through-hole 212 described later, is interposed between the first conductor 21 and the second conductor 22. In addition, a seal member 23 for restricting the inflow of the outside air into the reactor 12 is disposed between the second conductor 22 and the first conductor 21. The inner peripheral surface of the seal member 23 is in close contact with the outer surface 211 of the first conductor 21 and the outer peripheral surface of the seal member 23 is in close contact with the inner surface 221 of the second conductor 22. The seal member 23 is made of an insulating material that allows microwaves to pass therethrough.

The tip end of the first conductor 21 (that is, the upper end in the figure) is positioned in the reactor 12, and the workpiece W is installed on the tip end. That is, the tip of the first conductor 21 positioned in the reactor 12 serves as a support portion 21A that directly supports the workpiece W.

The second conductor 22 is grounded, and thus the potential of the second conductor 22 is "0 V". The tip end of the second conductor 22 (that is, the upper end portion in the figure) enters the reactor 12 through an opening portion 121 provided in the side wall of the reactor 12.

Furthermore, the PCVD apparatus 11 includes a high-frequency output device 30 which outputs microwaves and a DC power source 31 which supplies a DC voltage. The high-frequency output device 30 is provided with an output unit 301 which outputs microwaves, and the output unit 301 is connected to the first conductor 21 by passing through the through-hole 212 provided in the second conductor 22, that is, without coming into contact with the second conductor 22. The microwaves output from the high-frequency output device 30 flow through the outer surface 211 which is the surface of the first conductor 21. At this time, leakage of the microwaves flowing through the outer surface 211 of the first conductor to the outside of the apparatus is prevented by the second conductor 22.

In addition, the DC power source 31 is connected to the first conductor 21, and the DC voltage is supplied from the DC power source 31 to the first conductor 21. DC current flowing through the first conductor 21 also flows to the workpiece W supported by the first conductor 21. Accordingly, the workpiece W is charged with a negative charge. In this embodiment, the magnitude of the DC voltage supplied from the DC power source 31 is fixed.

During the formation of a film on the workpiece W, in a state in which the workpiece W is charged with the negative charge, microwaves are output from the high-frequency output device 30. Accordingly, the microwaves propagate to the surface of the workpiece W which is charged with the negative charge, and acetylene is decomposed into plasma in the vicinity of the workpiece W in the reactor 12. As a result, a DLC film based on the acetylene is formed on the surface of the workpiece W.

Moreover, in the PCVD apparatus 11 of this embodiment, an ammeter 32 for detecting a bias current of the workpiece W supported by the support portion 21A in the reactor 12 is provided. The ammeter 32 is disposed on an electric wire that connects the first conductor 21 and the DC power source 31 to each other. The "bias current of the workpiece W" is a current that flows into the DC power source 31 via the first conductor 21 from the workpiece W when the microwaves are input to the workpiece W and plasma is generated around the workpiece W.

Figure 2:
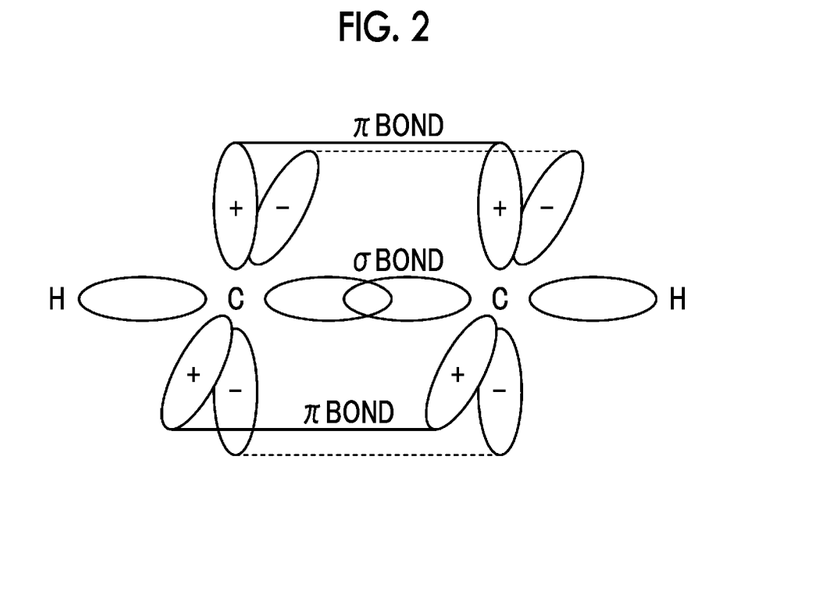
FIG. 2 is a schematic view showing the molecular structure of acetylene used in the film forming method.

Next, the molecular structure of the acetylene will be described with reference to FIG. 2. As illustrated in FIG. 2, acetylene has two carbon atoms and two hydrogen atoms. In addition, the bonds between the carbon atoms include π bonds, and a σ bond having a higher bond strength than the π bonds. In addition, in acetylene, the carbon atom and the hydrogen atom are bonded together. The strength of the bond between the carbon atom and the hydrogen atoms is higher than the strength of the π bond and is lower than the strength of the σ bond.

When the DLC film is formed on the workpiece W, acetylene is decomposed and adheres to the workpiece W. In order to cause the coefficient of friction of the DLC film formed on the workpiece W as described above to be low, in a case where the number of dangling bonds per unit volume is referred to as a content, it is desirable that the content of dangling bonds in the DLC film is increased. This is because as the content of dangling bonds increases, the amount of bonds between carbon atoms and hydroxy groups on the surface of the DLC film is likely to increase. In order to increase the content of dangling bonds in the DLC film, it is necessary to break more bonds between carbon atoms and hydrogen atoms when acetylene is decomposed into plasma.

In addition, when the DLC film formed on the workpiece W contains a large amount of hydrogen compounds, the hardness of the DLC film decreases. The DLC film is a film in which carbon having a diamond structure (also called "sp3 structure") and carbon having a carbon structure (also called "sp2 structure") coexist with each other, and the hardness of the DLC film increases as the proportion of carbon having the diamond structure increases. Therefore, in order to increase the hardness of the DLC film, it is necessary to increase the proportion of carbon having the diamond structure and to decrease the amount of hydrogen compounds in the DLC film.

Here, in a state in which the support portion 21A of the first conductor 21 supports the workpiece W in the reactor 12. In a case where the intensity SMW of the microwaves output from the high-frequency output device 30 is gradually increased from "0", the relationship between the intensity SMW and the bias current, the inventors obtained the following knowledge.

Figure 3:
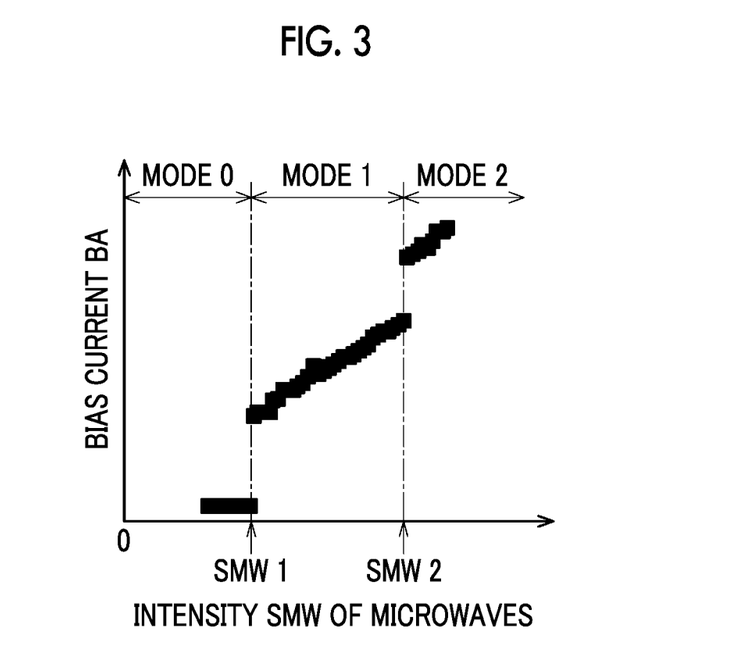
FIG. 3 is a graph showing a change in the bias current of a workpiece when the intensity of microwaves output from a high-frequency output device of the plasma chemical vapor deposition apparatus is increased from "0"

That is, as shown in FIG. 3, in a stage in which the intensity SMW of the microwaves is relatively low, the bias current BA of the workpiece W hardly changes although the intensity SMW of the microwaves increases. However, when the intensity SMW of the microwaves exceeds a first intensity SMW1, step-up of the bias current BA occurs. Thereafter, when the intensity SMW of the microwaves is further increased, the bias current BA gradually increases as the intensity SMW of the microwaves increases. When the intensity SMW of the microwaves exceeds a second intensity SMW2 which is higher than the first intensity SMW1, step-up of the bias current BA occurs again. Thereafter, when the intensity SMW of the microwaves is further increased, the bias current BA gradually increases as the intensity SMW of the microwave increases. That is, it can be inferred that the characteristics of materials adhering to the workpiece W vary between a case where the intensity SMW of the microwaves is equal to or lower than the first intensity SMW1, a case where the intensity SMW is higher than the first intensity SMW1 and lower than the second intensity SMW2, and a case where the intensity SMW is equal to or higher than the second intensity SMW2.

Figure 4:
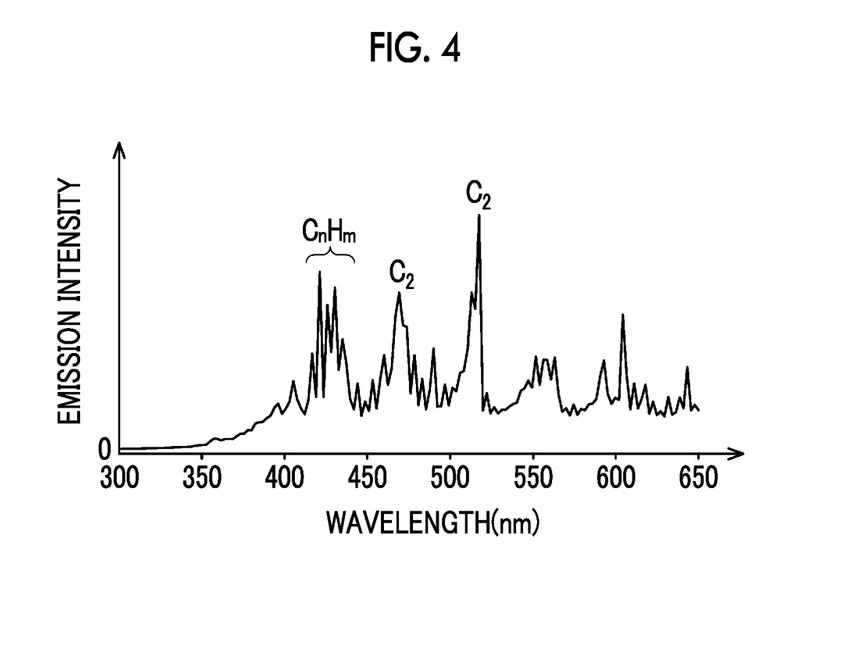
FIG. 4 is a graph showing an example of the spectrum of plasma generated in a reactor.

In addition, when the microwaves propagated to the workpiece W and plasma is generated around the workpiece W, a spectrum of the plasma as shown in FIG. 4 can be acquired by a well-known method. In FIG. 4, emission intensities in a wavelength region having wavelengths of "400 to 450 nm" are attributable to hydrogen compounds ($C_nH_m$) having carbon atoms and hydrogen atoms, and a higher emission intensity in the wavelength region can be regarded as a larger amount of hydrogen compounds in the plasma. In addition, both emission intensities in a wavelength region having wavelengths of "460 to 480 nm" and emission intensities in a wavelength region having wavelengths of "510 to 550 nm" are attributable to carbon molecules ($C_2$) having two carbon atoms, and a higher emission intensity in each of the wavelength regions can be regarded as a larger amount of carbon molecules in the plasma. In this specification, the emission intensities attributable to the hydrogen compounds are referred to as a "$C_nH_m$ emission intensity", and the emission intensities attributable to the carbon molecules having two carbon atoms are referred to as a "$C_2$ emission intensity". In the hydrogen compounds "$C_nH_m$", "n" represents the number of carbon atoms and "m" represents the number of hydrogen atoms.

Figure 5:
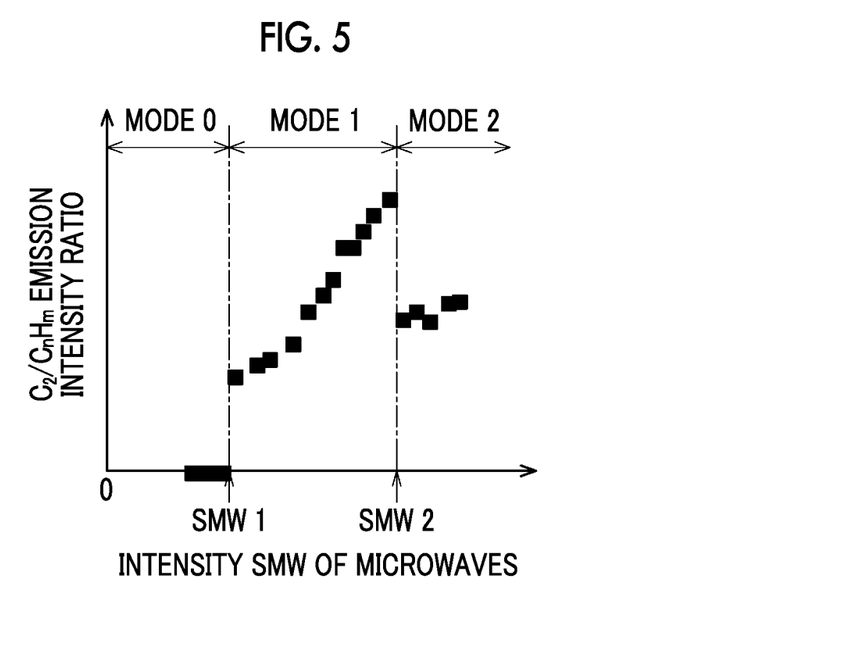
FIG. 5 is a graph showing a change in a $C_2/C_nH_m$ emission intensity ratio when the intensity of the microwaves output from the high-frequency output device of the plasma chemical vapor deposition apparatus is increased from "0"

By extracting each of the $C_2$ emission intensity and the $C_nH_m$ emission intensity from the spectrum of the plasma, a $C_2/C_nH_m$ emission intensity ratio which is the ratio of the $C_2$ emission intensity to the $C_nH_m$ emission intensity can be calculated. The emission intensity ratio changes as shown in FIG. 5 when the intensity SMW of the microwaves is gradually increased from "0". That is, as shown in FIG. 5, in a stage in which the intensity SMW of the microwaves is relatively low, the emission intensity ratio is substantially "0" although the intensity SMW of the microwaves increases. That is, the $C_2$ emission intensity is substantially "0". However, when the intensity SMW of the microwaves exceeds the first intensity SMW1, step-up of the $C_2$ emission intensity occurs, and step-up of the emission intensity ratio also occurs. Thereafter, when the intensity SMW of the microwaves is further increased, the emission intensity ratio gradually increases as the intensity SMW of the microwaves increases. When the intensity SMW of the microwaves exceeds the second intensity SMW2, step-down of the emission intensity ratio $C_2$ occurs, and thus step-down of the emission intensity ratio occurs.

That is, the inventors discovered that according to the intensity SMW of the microwaves output from the high-frequency output device 30 (that is, the intensity of the microwaves propagated to the workpiece W), the decomposition behavior of the acetylene in the reactor 12 is changed (see FIG. 5), and the way that the bias current BA of the workpiece W changes is changed (see FIG. 3).

In addition, in this specification, the generation of plasma after the intensity SMW of the microwaves output from the high-frequency output device 30 is set to be equal to or lower than the first intensity SMW1 is referred to as "mode 0". In addition, the generation of plasma after the intensity SMW of the microwaves is set to be higher than the first intensity SMW1 and lower than the second intensity SMW2 is referred to as "mode 1". Furthermore, the generation of plasma after the intensity SMW of the microwaves is set to be higher than the second intensity SMW2 is referred to as "mode 2".

Here, it is thought that when the acetylene is decomposed into plasma, the acetylene exhibits decomposition behaviors as represented by the following reaction equations (Equation 1), (Equation 2), (Equation 3), and (Equation 4).

$$C_2H_2 \rightarrow C_2H_2^* \quad \text{(Equation 1)}$$

$$C_2H_2 \rightarrow C_2H + H \quad \text{(Equation 1)}$$

$$C_2H_2 \rightarrow C_2 + 2H \quad \text{(Equation 1)}$$

$$C_2H_2 \rightarrow 2C + 2H \quad \text{(Equation 1)}$$

The decomposition behavior represented by the reaction equation (Equation 1) occurs when the $\pi$ bonds between the carbon atoms are broken while the $\sigma$ bond between the carbon atoms and the bonds between the carbon atoms and the hydrogen atoms are maintained. The decomposition behavior represented by the reaction equation (Equation 2) occurs when only one of the bonds between the carbon atoms and the hydrogen atoms is broken while both the $\pi$ bonds and the $\sigma$ bond between the carbon atoms are maintained. The decomposition behavior represented by the reaction equation (Equation 3) occurs when the $\pi$ bonds between the carbon atoms and the bonds between the carbon atoms and the hydrogen atoms are broken while the $\sigma$ between the carbon atoms is maintained. The decomposition behavior represented by the reaction equation (Equation 4) occurs when all of the $\pi$ bonds and the $\sigma$ bond between the carbon atoms and the bonds between the carbon atoms and the hydrogen atoms are broken.

Since the $\pi$ bonds between the carbon atoms are bonds that are more easily broken than the other bonds (that is, the $\sigma$ bond and the bonds between the carbon atoms and the hydrogen atoms), the decomposition behavior represented by the reaction equation (Equation 1) among the four decomposition behaviors more easily occurs than the other decomposition behaviors even though the energy input to the acetylene is low. Since the bonds between the carbon atoms and the hydrogen atoms are bonds that are more easily broken than the $\sigma$ bond between the carbon atoms, the decomposition behavior represented by the reaction equation (Equation 2) more easily occurs than the decomposition behaviors represented by the reaction equations (Equation 3) and (Equation 4) even though the energy input to the acetylene is low. The decomposition behavior represented by the reaction equation (Equation 3) more easily occurs than the decomposition behavior represented by the reaction equation (Equation 4) even though the energy input to the acetylene is low. The decomposition behavior represented by the reaction equation (Equation 4) is less likely to occur unless the energy input to the acetylene is high.

In the mode 0, as is apparent in FIG. 5, the $C_2/C_nH_m$ emission intensity ratio is extremely low. It can be inferred that this is due to the following reason. That is, in the mode 0, the intensity of the microwaves propagating to the workpiece W is low, and the energy input to the acetylene in the plasma is low. Therefore, the decomposition behavior represented by the reaction equation (Equation 1) and the decomposition behavior represented by the reaction equation (Equation 2) easily occur, while the decomposition behavior represented by the reaction equation (Equation 3) and the decomposition behavior represented by the reaction equation (Equation 4) are less likely to occur. Moreover, although it is said that the decomposition behavior represented by the reaction equation (Equation 1) and the decomposition behavior represented by the reaction equation (Equation 2) easily occur, in one acetylene molecule, only the $\pi$ bonds between the carbon atoms and one of the bonds between the carbon atoms and the hydrogen atoms are broken. As a result, in the mode 0, carbon molecules ($C_2$) having two carbon atoms are rarely generated, and hydrogen compounds ($C_nH_m$) having carbon atoms and hydrogen atoms are easily generated. Accordingly, in the mode 0, the $C_2/C_nH_m$ emission intensity ratio is extremely low.

In addition, in the mode 0, since the decomposition behavior represented by the reaction equation (Equation 3) or the reaction equation (Equation 4) is less likely to occur, in the DLC film formed on the workpiece W in the mode 0, the amount of the hydrogen compounds is large, the content of dangling bonds is low. Furthermore, as described above, since the $\pi$ bonds between the carbon atoms are less likely to be broken in the mode 0, in the DLC film, the proportion of carbon having the diamond structure among the types of carbon contained in the film is low.

In the mode 1, as is apparent in FIG. 5, the $C_2/C_nH_m$ emission intensity ratio is higher than that in the mode 0. It can be inferred that this is due to the following reason. That is, in the mode 1, since the intensity of the microwaves propagating to the workpiece W is higher than that in the mode 0, the energy input to the acetylene in the plasma is higher than in the case of the mode 0. Therefore, in the mode 1, the decomposition behavior represented by the reaction equation (Equation 3) mainly occurs among the decomposition behaviors represented by the reaction equations (Equation 1) to (Equation 4). As a result, in the mode 1, most of the bonds between the carbon atoms and the hydrogen atoms are broken, and thus the amount of generated hydrogen compounds ($C_nH_m$) having carbon atoms and hydrogen atoms is small. In addition, while the $\pi$ bonds between the carbon atoms are broken, a large amount of $\sigma$ the bonds between carbon atoms remain, and thus the amount of generated carbon molecules ($C_2$) having two carbon atoms is large. Accordingly, in the mode 1, the $C_2/C_nH_m$ emission intensity ratio is high.

In addition, in the mode 1, since the decomposition behavior represented by the reaction equation (Equation 3) mainly occurs, in the DLC film formed on the workpiece W in the mode 1, the amount of hydrogen compounds is small, and the content of dangling bonds is high. Furthermore, as described above, in the mode 1, while the $\pi$ bonds between the carbon atoms are broken, a large amount of $\sigma$ bonds between the carbon atoms remain, and the proportion of carbon having the diamond structure among the types of carbon contained in the film is high in the DLC film.

In the mode 2, as is apparent in FIG. 5, the $C_2/C_nH_m$ emission intensity ratio is higher than that in the mode 0. In addition, the $C_2/C_nH_m$ emission intensity ratio is lower than the maximum value in the case of the mode 1 (the value of the $C_2/C_nH_m$ emission intensity ratio when the intensity SMW of the microwaves is slightly lower than the second intensity SMW2). It can be inferred that this is due to the following reason. That is, in the mode 2, the intensity of the microwaves propagating to the workpiece W is very high, and the energy input to the acetylene in the plasma is very high. Therefore, the decomposition behavior represented by the reaction equation (Equation 4) mainly occurs. In this case, a larger amount of bonds between the carbon atoms and the hydrogen atoms are broken, and thus the amount of generated hydrogen compounds ($C_nH_m$) having carbon atoms and hydrogen atoms is small. In addition, in the mode 2, a slight amount of acetylene that exhibits the decomposition behavior represented by the reaction equation (Equation 3) is present, and thus a slight amount of carbon molecules ($C_2$) having two carbon atoms are generated. As a result, the $C_2/C_nH_m$ emission intensity ratio in the mode 2 has a value as shown in FIG. 5.

In the mode 2, since the decomposition behavior represented by the reaction equation (Equation 4) mainly occurs, in the DLC film formed on the workpiece W in the mode 2, the content rate of dangling bonds in the DLC film is high, and the amount of hydrogen compounds in the DLC film is small. In addition, as described above, in the mode 2, most of the π bonds and the σ bond between the carbon atoms are broken. When the acetylene is decomposed into plasma as described above, carbon atoms may be bonded together again in a process of adhering to the workpiece W. However, in order for carbon atoms to be bonded together to form σ bonds, higher energy than that in a case where carbon atoms are bonded together to form π bonds is necessary. That is, carbon atoms easily form π bonds but are less likely to form σ bonds. Therefore, in the DLC film formed on the workpiece W, the number of molecules with carbon atoms forming σ bonds is small, and the proportion of carbon having the diamond structure among the types of carbon contained in the DLC film is low.

Here, in the film forming method of this embodiment, film formation is performed in the mode 1 in a state in which the workpiece W is charged with a negative charge. As a result, a DLC film which satisfies all of a small amount of hydrogen compounds, a high content of dangling bonds, a high proportion of carbon having the diamond structure among the types of carbon contained in the film is formed on the workpiece W.

Incidentally, both of the first intensity SMW1, which is the intensity of the microwaves as the boundary between the mode 0 and the mode 1, and the second intensity SMW2 which is the intensity of the microwaves as the boundary between the mode 1 and the mode 2 are changed according to the pressure in the reactor 12, the concentration of the acetylene in the mixed gas supplied into the reactor 12, and the magnitude of the DC voltage supplied from the DC power source 31.

Figure 6:
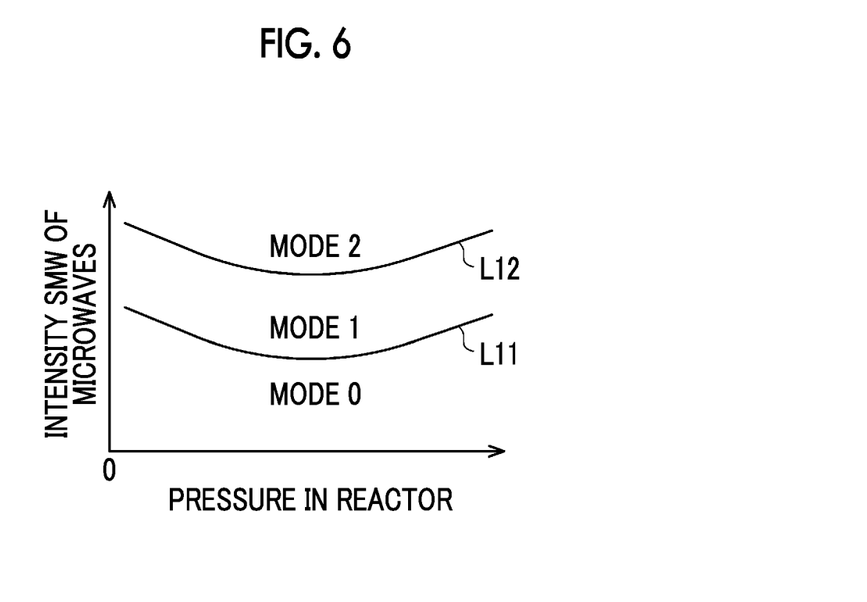
FIG. 6 is a graph showing the relationship between a first intensity, a second intensity, and a pressure in the reactor.

That is, FIG. 6 shows changes in the first intensity SMW1 and the second intensity SMW2 when the pressure in the reactor 12 is changed while the concentration of the acetylene in the mixed gas supplied into the reactor 12 and the magnitude of the DC voltage supplied from the DC power source 31 are fixed. In FIG. 6, a boundary line L11 represents the first intensity SMW1, and a boundary line L12 represents the second intensity SMW2. As shown in FIG. 6, when the pressure in the reactor 12 is gradually increased, both the first intensity SMW1 and the second intensity SMW2 decrease. However, when the pressure in the reactor 12 becomes higher than a certain pressure, both the first intensity SMW1 and the second intensity SMW2 increase as the pressure increases from the certain pressure.

Figure 7:
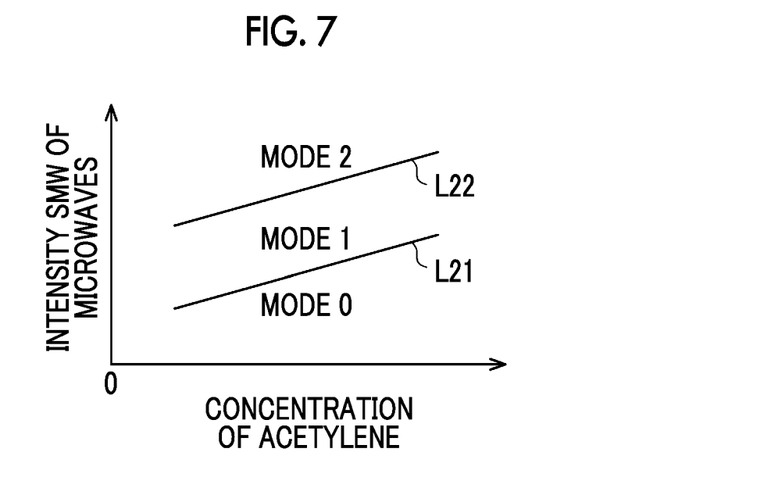
FIG. 7 is a graph showing the relationship between the first intensity, the second intensity, and the concentration of the acetylene in a mixed gas supplied into the reactor.

In addition, FIG. 7 shows changes in the first intensity SMW1 and the second intensity SMW2 when the concentration of the acetylene in the mixed gas supplied into the reactor 12 is changed while the pressure in the reactor 12 and the magnitude of the DC voltage supplied from the DC power source 31 are fixed. In FIG. 7, a boundary line L21 represents the first intensity SMW1, and a boundary line L22 represents the second intensity SMW2. As the concentration of the noble gas in the mixed gas increases, plasma is easily generated. Therefore, as shown in FIG. 7, both the first intensity SMW1 and the second intensity SMW2 decrease as the concentration of the acetylene of the mixed gas decreases, that is, as the concentration of the noble gas increases.

Figure 8:
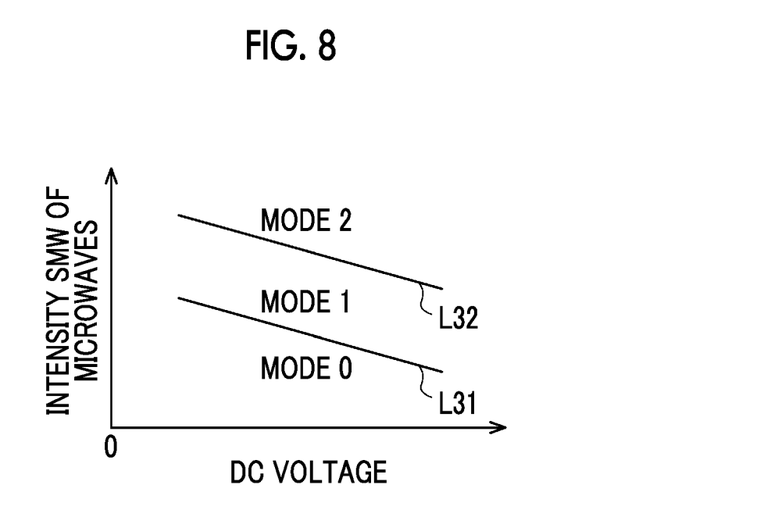
FIG. 8 is a graph showing the relationship between the first intensity, the second intensity, and a DC voltage supplied from a DC power source.

In addition, FIG. 8 shows changes in the first intensity SMW1 and the second intensity SMW2 when the magnitude of the DC voltage supplied from the DC power source 31 is changed while the pressure in the reactor 12 and the concentration of the acetylene in the mixed gas supplied into the reactor 12 are fixed. In FIG. 8, a boundary line L31 represents the first intensity SMW1, and a boundary line L32 represents the second intensity SMW2. As the magnitude of the DC voltage supplied from the DC power source 31 increases, the amount of the negative charge of the workpiece W increases. Therefore, as shown in FIG. 8, both the first intensity SMW1 and the second intensity SMW2 decrease as the DC voltage supplied from the DC power source 31 increases.

Figure 9:
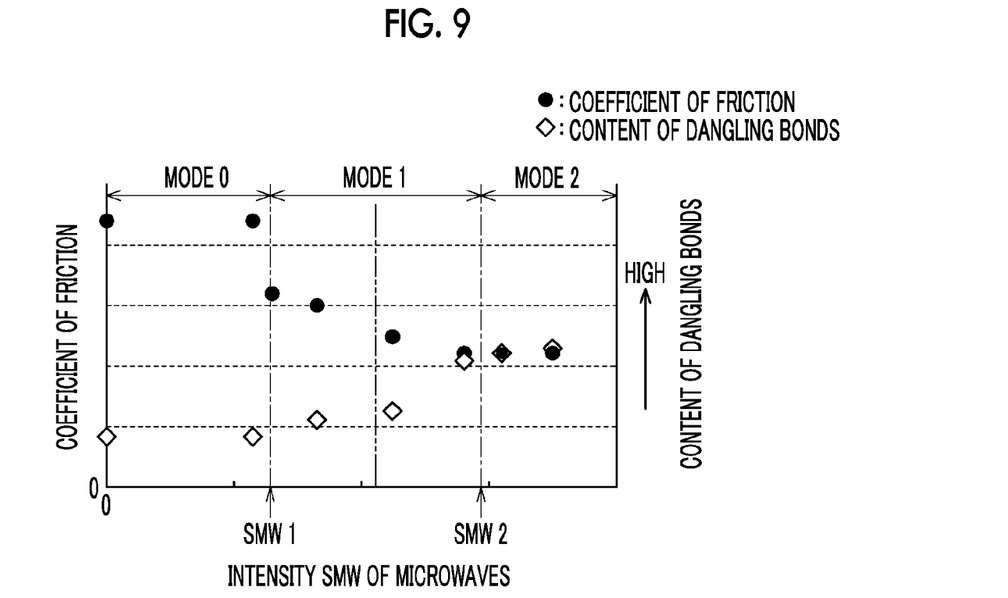
FIG. 9 is a graph showing the relationship between the intensity of the microwaves output from the high-frequency output device, the coefficient of friction of a diamond-like carbon film formed on the workpiece, and the content of dangling bonds of the film.
Figure 10:
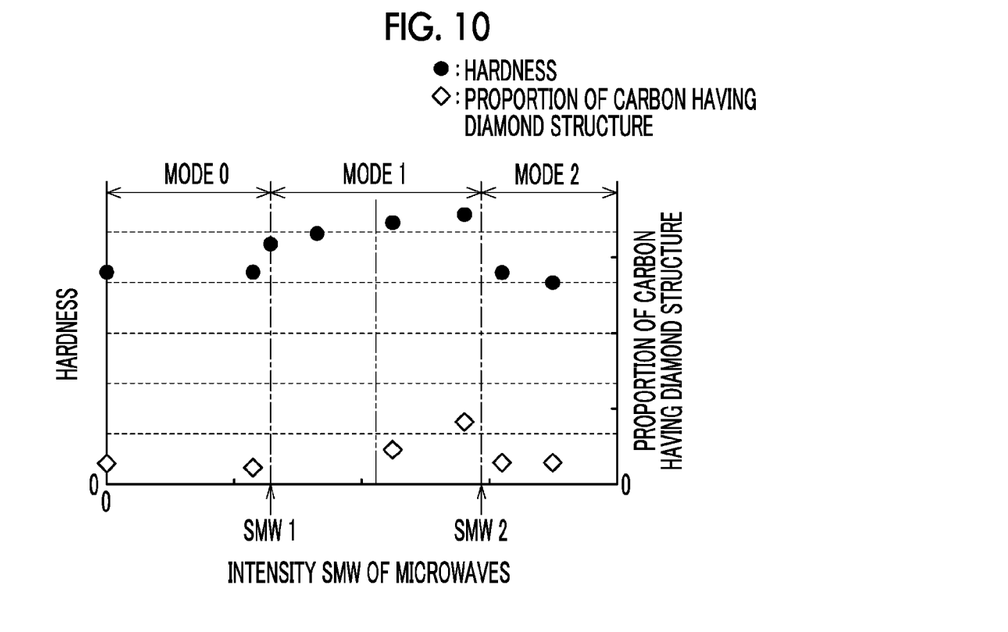
FIG. 10 is a graph showing the relationship between the intensity of the microwaves output from the high-frequency output device, the hardness of the diamond-like carbon film formed on the workpiece, and the proportion of carbon having a diamond structure among the types of carbon contained in the film.

Next, the comparison between the characteristics of the DLC films formed on the workpiece W in the respective modes will be described with reference to FIGS. 9 and 10. In FIG. 9, "•" is a plot of the coefficient of friction of the DLC film, and "◊" is a plot of the content of dangling bonds of the DLC film. In FIG. 10, "•" is a plot of the hardness of the DLC film, and "◊" is a plot of the proportion of carbon having the diamond structure in the DLC film.

As shown in FIG. 9, in the DLC film formed on the workpiece W in the mode 0, the content of dangling bonds is lower than the contents dangling bonds of the DLC films formed on the workpiece W in the mode 1 and the mode 2. As a result, on the surface of the DLC film formed in the mode 0, hydroxy groups are less likely to be bonded to carbon atoms, and the coefficient of friction of the DLC film becomes high. Contrary to this, in the DLC films formed in the mode 1 and the mode 2, the content of dangling bonds is high, and thus hydroxy groups are easily bonded to carbon atoms on the surface. As a result, the coefficients of friction of the DLC films are low.

In addition, as shown in FIG. 10, in the DLC film formed on the workpiece W in the mode 1, the proportion of carbon having the diamond structure is higher than the proportions of the DLC films formed on the workpiece W in the mode 0 and the mode 2. As a result, the hardness of the DLC film formed in the mode 1 is higher than the hardnesses of the DLC films formed in the mode 0 and the mode 2.

More specifically, as microwaves having an intensity SMW of higher than the intermediate value (=(SMW1+SMW2)/2) between the first intensity SMW1 and the second intensity SMW2 and lower than the second intensity SMW2 are output from the high-frequency output device 30, a DLC film which achieves both high hardness and a low coefficient of friction to a high level is formed on the workpiece W. In addition, the two-dot chain line in FIGS. 9 and 10 is a line representing the intermediate value.

Here, as a film forming method of a comparative example, a method using a PCVD apparatus in which a dielectric is interposed between a workpiece W installed in a reactor and a waveguide will be described. In the film forming method of this comparative example, plasma is generated around the dielectric in the reactor. Therefore, in order to cause acetylene decomposed into the plasma to adhere to the entire workpiece W supported by the dielectric, it is necessary to cause microwaves having a higher intensity to propagate to the dielectric. That is, although film formation in the mode 2 is possible, film formation in the mode 1 cannot be performed. Therefore, a DLC film formed by the film forming method of this comparative example has a low coefficient of friction but has low hardness.

Contrary to this, in the film forming method of this embodiment, microwaves can be directly input to the workpiece W, and thus plasma is generated around the workpiece W in the reactor 12. Therefore, even when microwaves having a lower intensity than that in the case of the film forming method of the comparative example are output from the high-frequency output device 30, it is possible to form a DLC film over the entire workpiece W. That is, film formation in the mode 1 becomes possible.

As described above, according to the film forming method of this embodiment, the following effects can be obtained. (1) In this embodiment, the DLC film is formed on the workpiece W in the mode 1. Therefore, a DLC film which achieves both high hardness and a low coefficient of friction to a high level can be formed on the workpiece W.

(2) Furthermore, when a film is formed on the workpiece W, the workpiece W is charged with a negative charge. Therefore, compared to a case of forming a film on the workpiece W which is not charged with a negative charge, acetylene decomposed into plasma in the reactor 12 is more likely to adhere evenly to the entire workpiece T.

(3) Moreover, in this embodiment, the first conductor 21 for supplying the microwaves to the workpiece W is also used for supplying DC current to the workpiece W. Therefore, compared to a case where a supply path for DC current is provided separately from a supply path for microwaves, film formation on the workpiece W can be performed with an apparatus having a simple configuration. In addition, since the second conductor 22 is disposed on the outer peripheral side of the first conductor 21, leakage of the microwaves to the outside of the apparatus can be prevented.

The above-described embodiment may be changed to other embodiments described below. The noble gas supplied into the reactor 12 together with the acetylene may also be a gas other than argon (krypton, xenon, or the like).

A supply path for DC current to the workpiece W may be provided separately from the waveguide member 20 as long as the workpiece W installed in the reactor 12 can be charged with a negative charge. The workpiece W may not be charged with a negative charge as long as film formation on the workpiece W in the mode 1 is possible. In this case, as is also apparent in FIG. 8, it is thought that the first intensity SMW1 and the second intensity SMW2 are higher than those in the above-described embodiment.

The first conductor 21 may not have a cylindrical (hollow) shape as in the above-described embodiment as long as microwaves flow on the surface, and may have, for example, a columnar (solid) shape. In addition, the hydrocarbon gas usable in the film forming method may be a gas other than acetylene as long as the following conditions are satisfied. (Condition 1) A gas having two or more carbon atoms and two or more hydrogen atoms. (Condition 2) A gas which cause step-up of the bias current of the workpiece W only twice in a process of gradually increasing the intensity of the microwaves propagating to the workpiece W from "0".

What is claimed is:

1. A method of forming a diamond-like carbon film on a workpiece installed in a reactor of a plasma chemical vapor deposition (PCVD) apparatus, wherein the PCVD apparatus includes:
   (i) a microwave output device which outputs microwaves, and
   (ii) a waveguide member which extends to an inside of the reactor from an outside of the reactor, wherein the waveguide member supports the workpiece with a portion of the waveguide member positioned in the reactor, and the waveguide member is configured to propagate the microwaves from the microwave output device to the workpiece, the method comprising:
   supplying a hydrocarbon gas into the reactor of the PCVD apparatus;
   outputting microwaves having an intensity of higher than a first intensity and lower than a second intensity from the microwave output device, through the waveguide member and to the workpiece to decompose the hydrocarbon gas into a plasma and to form the diamond-like carbon film on the workpiece, wherein:
   the first intensity and the second intensity are defined by a method comprising:
     supplying the hydrocarbon gas into the reactor of the PCVD apparatus;
     outputting microwaves having a third intensity starting from "0" intensity from the microwave output device, through the waveguide member and to the workpiece;
     increasing the third intensity of microwaves outputted from the microwave output device;
     defining the first intensity to be the third intensity when a first step-up of a bias current of the workpiece occurs;
     further increasing the third intensity of microwaves outputted from the microwave output device;
     defining the second intensity to be the third intensity when a second step-up of the bias current of the workpiece occurs;
     wherein the first step-up and the second step-up of the bias current are each a sudden discontinuous increase in the bias current of the workpiece, and
   wherein the hydrocarbon gas: (i) is acetylene or a hydrocarbon gas having two or more carbon atoms and two or more hydrogen atoms, and (ii) causes step-up of the bias current of the workpiece only twice.

2. The method according to claim 1, wherein the outputting of the microwaves having an intensity of higher than the first intensity and lower than the second intensity from the microwave output device, further comprises supplying a DC current to the workpiece to charge the workpiece with a negative charge.

3. The method according to claim 2, wherein
   the waveguide member of the plasma chemical vapor deposition apparatus has an elongated first conductor of which one end is positioned in the reactor to support the workpiece with the one end, and a cylindrical second conductor which is positioned on an outer peripheral side of the first conductor and is disposed coaxially with the first conductor, and
   the supply of DC current to the workpiece further comprises supplying a DC voltage to the first conductor which charges the workpiece with a negative charge, and causes the microwaves output from the microwave output device to flow through a surface of the first conductor.

4. The method according to claim 1, wherein the intensity of the microwaves is higher than an intermediate value between the first intensity and the second intensity and lower than the second intensity.

\* \* \* \* \*